United States Patent
Meagley (10) Patent No.: US 6,872,513 B2
(45) Date of Patent: Mar. 29, 2005

(54) PHOTORESIST EDGE CORRECTION (75) Inventor: Robert P. Meagley, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 126 days.

(21) Appl. No.: 10/304,989

(22) Filed: Nov. 26, 2002

(65) Prior Publication Data

US 2004/0101786 A1 May 27, 2004

(51) Int. Cl.$^7$ .................................................. G03F 7/26
(52) U.S. Cl. ........................ 430/324; 430/325; 430/330
(58) Field of Search ................................. 430/311, 322, 430/315, 324, 325, 328, 330

(56) References Cited

U.S. PATENT DOCUMENTS

2002/0160316 A1 * 10/2002 Richter et al. .............. 430/324
2003/0148212 A1 * 8/2003 Lee et al. ................ 430/270.1

* cited by examiner

Primary Examiner—Kathleen Duda
(74) Attorney, Agent, or Firm—John F. Travis (57) ABSTRACT

The sloped edges of patterned photoresist material are made more vertical by treating the exposed and developed photoresist pattern to an edge correction process. A layer of acid-based material is deposited on the photoresist pattern. The layer is then exposed to acid-neutralizing light to create a top-to-bottom gradient of acidity. The structure is then exposed to heat to cause the acid to diffuse into the edge of the photoresist in amounts roughly proportional to the gradient. A subsequent development process removes the acid-based layer and also reshapes the photoresist edge in proportion to the acid diffusion, leaving a more vertical edge.

17 Claims, 6 Drawing Sheets

PHOTORESIST EDGE CORRECTION

BACKGROUND

1. Technical Field

An embodiment of the invention relates generally to integrated circuit fabrication, and in particular relates to photoresist material processing.

2. Description of the Related Art

During the manufacture of integrated circuits on a wafer, a common processing operation is to etch a layer of the wafer into a predetermined pattern. The etch pattern is produced by coating the target layer (the layer to be etched) with photoresist material, exposing the photoresist material to light in the predetermined pattern, and then using a development process to remove only the exposed portions of photoresist in a positive tone process (or alternately, to remove only the unexposed portions of photoresist in a negative tone process). The remaining photoresist material then acts as a mask for a subsequent etching process. Because the photoresist material is relatively resistant to the etch process, the portions of the target layer not covered by photoresist are etched away, while the portions of the target layer covered by the photoresist are preserved. The remaining photoresist is then removed, leaving the target layer etched in the predetermined pattern.

When photoresist material absorbs the exposure light, the bottom portion of the photoresist layer receives less light and is less affected by the exposure than the upper portion. The bottom portion is therefore more likely to resist removal during the development process. This depth-related exposure gradient, combined with edge effects along the exposed/non-exposed transition areas and/or enhanced solubility of the photoresist material at the top of the resist feature, produces sloped edges on the photoresist material. The sloped edges in turn effect the accuracy of the subsequent etch process, making the profile of the etched features difficult to fabricate as square (e.g., 90 degree side-wall angle) and hard to accurately control. Although this may not be as much of a problem for large features, the edge uncertainty and non-square profiles can make very small features (e.g., transistor gates) unusable and thus places a limit on how small the features in the integrated circuit can be. This is especially a problem with photoresist materials performing at the limits of resolution of deep ultraviolet, vacuum ultraviolet and extreme ultraviolet exposure light or e-beam, which is necessary for very small feature sizes. Similar effects have been noted for other techniques for direct writing of features such as the Atomic Force Microscope technique (AFM).

BRIEF DESCRIPTION OF THE DRAWINGS

The invention may be understood by referring to the following description and accompanying drawings that are used to illustrate embodiments of the invention. In the drawings.

DETAILED DESCRIPTION OF THE INVENTION

In the following description, numerous specific details are set forth. However, it is understood that embodiments of the invention may be practiced without these specific details. In other instances, well-known elements and techniques have not been shown in detail in order not to obscure an understanding of this description.

References to "one embodiment", "an embodiment", "example embodiment", "various embodiments", etc., indicate that the embodiment(s) of the invention so described may include a particular feature, element, or characteristic, but not every embodiment necessarily includes the particular feature, element, or characteristic. Further, repeated use of the phrase "in one embodiment" does not necessarily refer to the same embodiment, although it may.

The term "structure", as used herein, refers collectively to a substrate and all existing layers at the indicated stage in the fabrication process, and to the physical elements in those layers that are being processed together. The terms "up", "down", "top", "bottom", "vertical", and "horizontal", as used herein, refer to the orientations shown in the drawings, and not necessarily to the orientation defined by gravity for actual devices or actual processes. The term "patterned photoresist", as used herein, refers to a layer of photoresist material in which selected portions of the photoresist material have been removed, exposing portions of the underlying layer in a predetermined pattern.

Various embodiments of the invention may improve the critical dimensions in a patterned photoresist by treating the developed photoresist pattern to an edge correction process to produce edges that are more vertical. A layer of acid-based material is deposited on the patterned photoresist, and the acid-based layer is then treated by a first process to create a top-to-bottom gradient of acidity. The structure is then treated by a second process to cause acid to diffuse into the edges of the photoresist material in approximate proportion to the gradient. A third process removes the acid-based layer and also reshapes the edges by removing portions of the photoresist material into which the acid has diffused, thus creating more nearly vertical edges on the photoresist.

FIGS. 1A–1G show a cross-section of a wafer at various fabrication stages, according to one embodiment of the invention. FIG. 2 shows a flow chart of a method of fabricating an embodiment of the invention. Although the following description sometimes refers both to FIGS. 1A–1G and to FIG. 2, it is obvious that the embodiment of FIGS. 1A–1G and the embodiment of FIG. 2 may be practiced independently of each other.

Figure 1A:
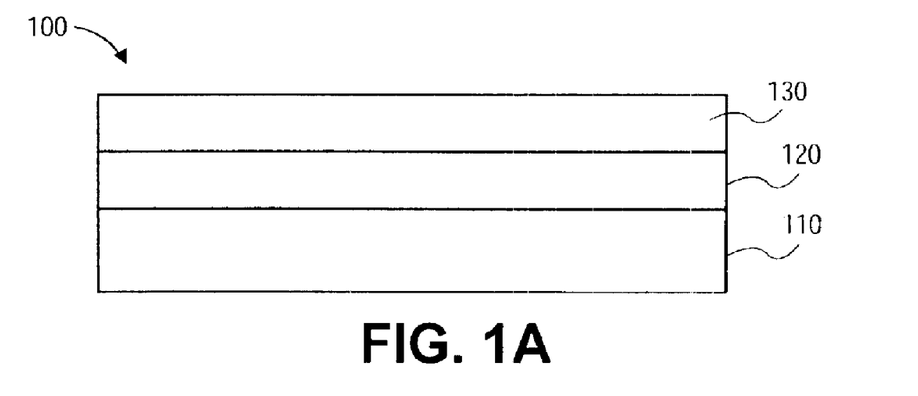
FIGS. 1A–1G show a cross-section of a wafer at various fabrication stages, according to one embodiment of the invention.
Figure 2:
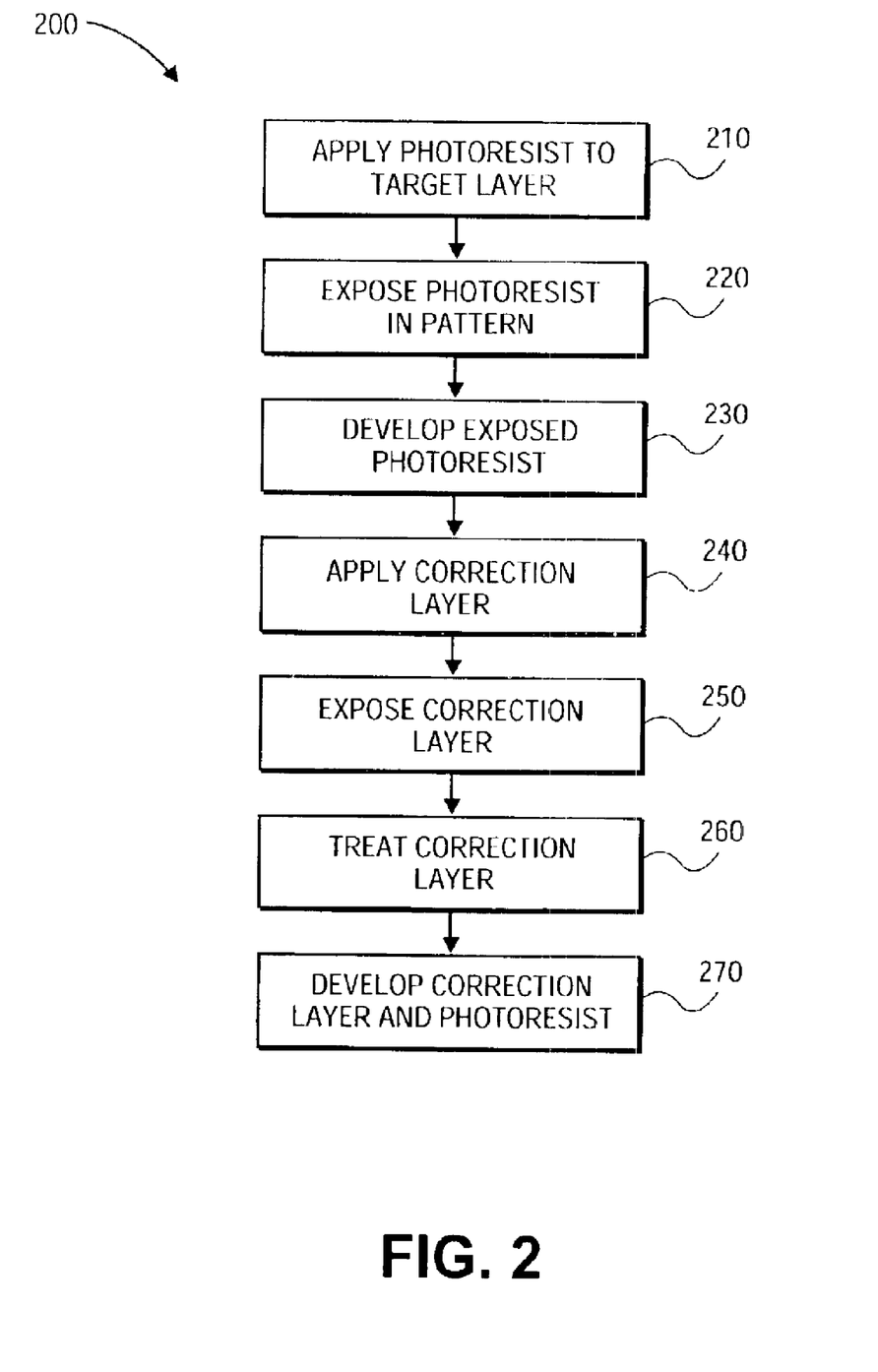
FIG. 2 shows a flow chart of a method of fabricating an embodiment of the invention.

FIG. 1A shows three layers of material in a structure 100 (e.g., a wafer during fabrication). A layer of photoresist material 130 is on a target layer 120, which is on a base layer 110. Target layer 120 is so-named in this description because it is the target of a subsequent etching process, and will be etched into a predetermined pattern by that etching process. In one embodiment target layer 120 is comprised of silicon oxynitride, but other embodiments may use other materials (e.g., silicon nitride, silicon oxide, etc.). Base layer 110 is the underlying layer beneath target layer 120. Base layer 110 provides physical support for target layer 120, and in one embodiment may serve as an etch-stop layer to prevent the aforementioned etch process from etching anything beneath target layer 120. In one embodiment base layer 110 is the pre-fabrication substrate of the wafer, and in a particular embodiment is comprised of polycrystalline silicon. In another embodiment, base layer 110 is one of one or more layers that are deposited on the pre-fabrication substrate during fabrication. In a particular embodiment, base layer 110 may also be etched in a subsequent process, using the etched features in target layer 120 as a mask. The photoresist layer is comprised of photoresist material 130 deposited on target layer 120, and is to be processed in a manner that allows the target layer 120 to be selectively etched into the predetermined pattern. While various materials may be used for the photoresist layer, one embodiment uses acrylic polymer (e.g., at least one of acrylate, methacrylate, acrylate with a methyl group on backbone, acrylate-methacrylate copolymers, etc.), but other embodiments may use other materials, e.g., SAFARI polymer, ESCAP polymer, parahydroxystyrene polymer, NBHFA polymer, etc. In one embodiment the photoresist material may have a thicknesses of approximately 0.25 microns, but other embodiments may use other thicknesses.

Block 210 of flow chart 200 in FIG. 2 describes applying the photoresist material to the target layer. Application of the photoresist material 130 to the target layer 120 may take various forms in various embodiments, but in a particular embodiment, application of the photoresist layer includes: 1) heating the structure at 200 degrees Celsius (° C.) for 1 to 5 minutes followed by cooling to ambient, 2) applying the resist material on the surface of the structure, 3) spinning the structure at 3,000 rpm for 25 second to thin the resist material to the desired thickness, and 4) heating the structure at 115° C. for about 2 minutes to bake the resist material and remove solvent to form the photoresist film.

Figure 1B:
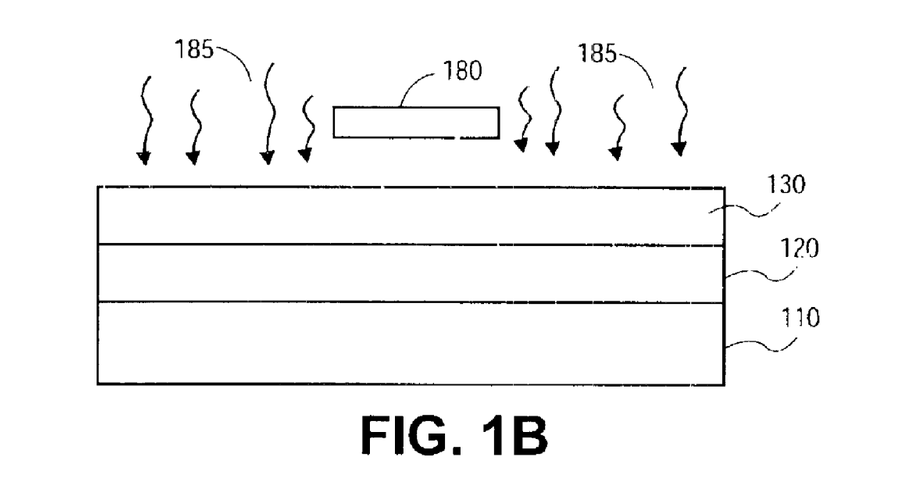

Block 220 of FIG. 2 describes exposing the photoresist in a pattern, and FIG. 1B shows a cross section of the structure with the photoresist material being exposed with a mask. Radiation 185 is directed onto photoresist layer 130 in a predetermined pattern that directs the radiation to particular portions of the surface of the photoresist material but not to other portions. For simplicity, FIG. 1B shows a very simple pattern with radiation 185 being directed to right and left portions of the photoresist material 130, but not to the center portion. Other embodiments may use different and/or complex patterns. As depicted, in one embodiment radiation exposure take place through all portions of the mask simultaneously, however another embodiment may irradiate the mask pattern by scanning a line of radiation across the mask. In one embodiment the radiation is in the deep ultraviolet range, i.e., wavelengths below 200 nanometers (nm), but other embodiments may use radiation of other wavelengths of light (e.g., broadband ultraviolet, g-line, i-line, 254 nm, 248 nm), e-beam, ion beam radiation in addition to alternative exposure methods such as AFM. One method of creating the radiation pattern is to direct the radiation through a transmissive mask 180, while another method may reflect the radiation off a reflective mask (not shown). Either method may reduce the resulting pattern with a focusing lens system (not shown). Techniques for exposing photoresist material are well known and are not described here in greater detail to avoid obscuring an understanding of the embodiments of the invention.

Radiation 185 may cause changes in the chemical and/or molecular structure of photoresist material 130, so that either the exposed or the non-exposed portions of photoresist material 130 may be selectively removed by a subsequent development operation. With positive tone photoresist material, the exposed areas of material are removed, while with negative tone photoresist material, the unexposed areas of material are removed. In one embodiment the described processes are applied to positive-tone photoresist material. The amount of exposure energy that it takes to create the necessary changes in the photoresist material 130 may depend on various factors, such as the type of material, the wavelength of the radiation, the thickness of the photoresist layer, etc. In one embodiment, the total exposure energy (e.g., radiation intensity×exposure time) is approximately 20 millijoules per square centimeter (mJ/cm$^2$), but other embodiments may use other energies. Techniques for developing photoresist material are well known and are not described further.

Block 230 of FIG. 2 describes developing the exposed photoresist material. Developing the photoresist material (i.e., removal of the selected areas of photoresist material) may take various forms in various embodiments, but in a particular embodiment, development includes: 1) treatment of the structure with a solution of developer in water, 2) spinning the structure to disperse and then remove the developer, 3) rinsing the structure in deionized water for about 1 minute, and 4) spinning the structure until dry.

Figure 1C:
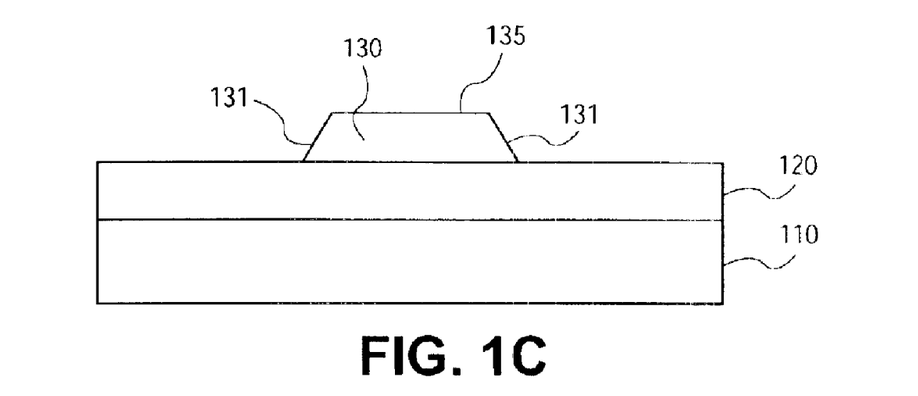

FIG. 1C shows a feature 135 of the developed photoresist material 130 after the expose-and-develop operations have been performed, according to one embodiment of the invention. While only one feature is illustrated, it is understood that in most embodiments multiple features, in various sizes and shapes, may be created concurrently by the same expose-and-develop operations due to the many separate areas defined by the exposure mask. As shown in FIG. 1C, the edges 131 of the feature 135 may be sloped rather than having the desired vertical orientation. This may be due to the absorbency of the photoresist material during exposure, though other effects, such as poisoning effects induced by the substrate (e.g., silicon nitride) may give similar results. As the radiation penetrates the photoresist material, some of the radiation is absorbed by the photoresist material so that less radiation reaches the bottom of the photoresist layer. This effect, combined with various radiation edge effects at the edge of the exposure areas, may cause the lower areas of the photoresist material in the exposed/non-exposed transition areas to be less changed by the exposure and thus harder to remove during the development operation. The result may be the sloped edges 131 shown. Since the edges 131 of the feature 135 are to define the edges in a subsequent etch operation, the sloped edges 131 may create uncertainty in where the edges of the final etched features in target layer 120 are to be located, which would limit the minimum feature size that can be reliably created in target layer 120.

Figure 1D:
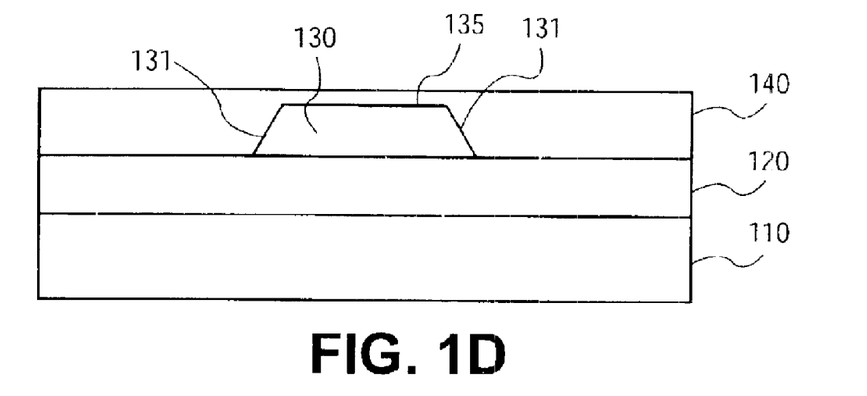

Block 240 of FIG. 2 describes applying a correction layer, while FIG. 1D shows the correction layer after it is applied to the structure of FIG. 1C, according to one embodiment of the invention. In the illustrated embodiment, the exposed surface of the structure (e.g., feature 135 and areas of target layer 120 that are not covered by remaining portions of photoresist material) is coated with a correction layer 140. The correction layer 140 is in intimate contact with the edges of the patterned photoresist material and with the exposed portions of the target layer 120. In one embodiment the correction layer 140 is at least as thick as the feature 135 and is in intimate contact with the top surface of the feature 135, but other embodiments may use other thicknesses (e.g., between approximately 80% and 99% as thick as feature 135, which would leave the upper 1%–20% of the edges uncorrected by the subsequent processes).

The correction layer 140 may be comprised of various materials and be formed using various techniques. In one embodiment, a material is prepared for the correction layer by treating a solution of parahydroxystyrene/acrylic acid copolymer in solvent (e.g., 5% polymer in propylene glycol methyl ether (PGME)/ethanol with photobase additive (e.g., quaternary ammonium dithiocarbamate and/or α-keto carbamate at 10 dry wt %). To this solution is added acid (e.g., 10 dry wt % naphthalene sulfonic acid and/or nonafluorobutane sulfonic acid) and a dye, and the resulting mixture is stirred at room temperature until homogeneous. The solution is then filtered, for example through a 0.02 micron HDPE (high density polyethylene) filter. The solution may be applied using various techniques (e.g., dispensing 5.0 milliliters (ml) of the solution to the center of the wafer, spinning the wafer to render a thin uniform coating across the patterned area, and then baking the wafer to remove solvent from the film). Other techniques may also be used to create and apply the correction layer.

Figure 1E:
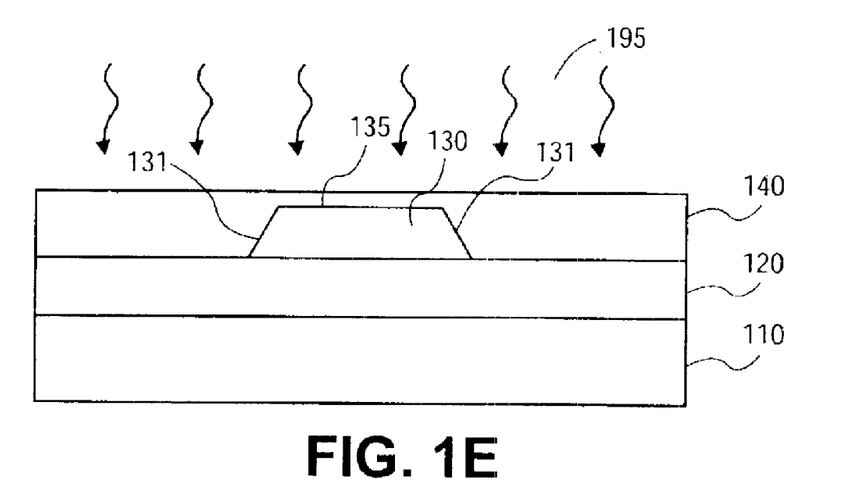

Block 250 of FIG. 2 describes exposing the correction layer, while FIG. 1E shows the correction layer being exposed, according to one embodiment of the invention. The correction layer 140 may be exposed to electromagnetic radiation 195 to neutralize some of the acid contained in correction layer 140. In one embodiment, the exposure comprises deep ultraviolet radiation, (i.e. with a wavelength of less than 200 nm, for example 193 nm), but other embodiments may use radiation in other wavelength bands. In one embodiment the amount of energy delivered by radiation 195 is 20 mj/cm$^2$, but other embodiments may use other amounts of radiation energy at various wavelengths. The material in correction layer 140 absorbs a portion of the radiation (e.g. in one embodiment the photobase generator and the polymer act as dyestuffs, however in other embodiments a dye may be added to further modulate the absorbance of the correction layer). Thus the lower areas of the correction layer 140 receive proportionately less radiation than the upper areas. The radiation may react with the photobase generator in the correction layer 140 to create base that neutralizes the acid. Note that the upper areas of the correction layer 140 receive and absorb more radiation than the lower areas, thus the upper areas have a greater portion of their acid neutralized by the absorbed radiation. Therefore, with exposure the upper areas of the correction layer become relatively less acidic than the lower areas of the correction layer. This may establish within the correction layer a top-to-bottom gradient of acid concentration, with the lower portions having a higher acid concentration than the upper portions.

Figure 1F:
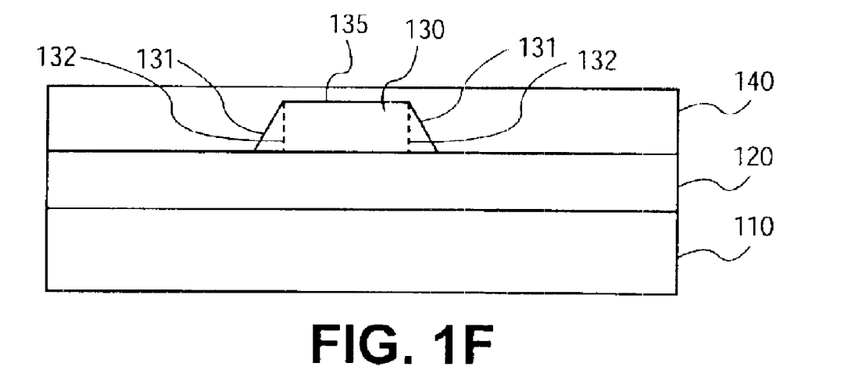

Block 260 of FIG. 2 describes an operation of treating the correction layer, while FIG. 1F shows the structure that is being treated to cause acid to diffuse into the feature, according to one embodiment of the invention. In one embodiment the structure is heated to cause diffusion of the acid from the correction layer 140 into the feature 135. In a particular embodiment the structure is heated at 130° C. for about 60 seconds, but other embodiments may use other temperatures and/or times. Because the concentration of acid is strongest in the lower areas of the correction layer, a greater amount of acid may diffuse into the feature 135 in the lower areas of the sloped edges 131. A stronger concentration of acid may permit deeper diffusion of an effective amount of acid, where 'effective amount' is the amount of acid in the photoresist material 130 that facilitates removal of the photoresist material 130 during a subsequent development operation. Therefore, in one embodiment the portions of feature 135 that have an effective amount of diffused acid may be defined as approximately the portions of photoresist material between the edges 131 and the dashed lines 132 of FIG. 1F.

Figure 1G:
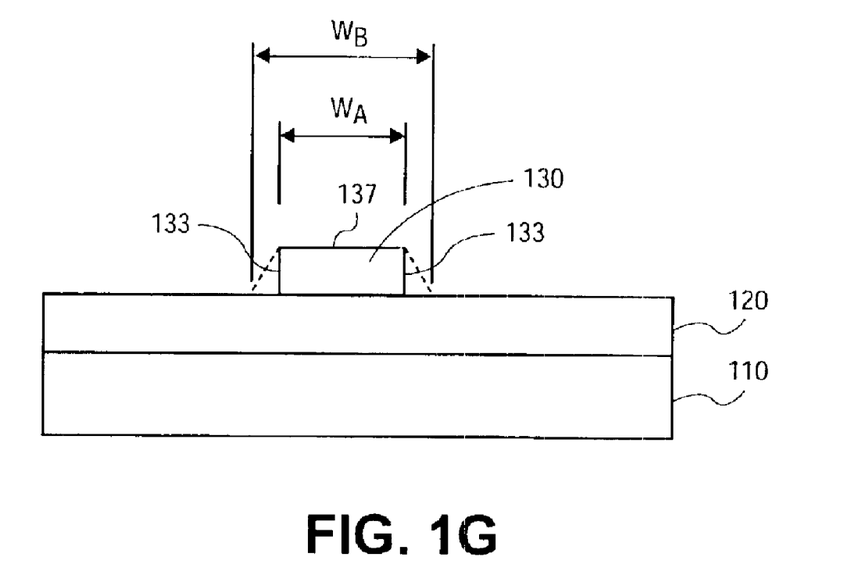

Block 270 of FIG. 2 describes developing the correction layer and photoresist material, while FIG. 1G shows the feature 135 after the development operation, according to one embodiment of the invention. The development operation may serve various purposes, including: 1) to remove the material of correction layer 140, 2) to reshape the edges of the patterned photoresist by removing the portion of the photoresist material that contains an effective amount of diffused acid, 3) smooth the edges of the patterned photoresist, and 4) reduce the width of the patterned photoresist feature (i.e., the critical dimension or "CD"). In one embodiment a single development operation removes both the correction layer 140 and the affected portions of the photoresist layer 130. In the illustrated embodiment of FIG. 1G, the development operation removes photoresist material in such a way as to increase the slope of the edge by leaving feature 135 with approximately vertical edges 133. The texture of edge 133 may also be rendered more uniform and smoother in the process, relative to pre-correction edges 131. In other words, the portion of photoresist material approximately between vertical edges 133 and the dashed lines that represent the previous sloped edges 131 is removed during the development operation. It is understood that the straight edges 133 and 131 of the drawings represent idealized edges, and that actual edges may not be completely straight, smooth or vertical. It is also understood that in the process of correcting the sidewall slope, the width of the feature (i.e. the CD) may be reduced, and this CD reduction may be optimized. A person of ordinary skill in the art should be able to apply the disclosed concepts and idealized drawings to actual implementations without creative effort or undue experimentation.

In one embodiment the development operation is a single operation that removes both the material of correction layer 140 and the portions of photoresist layer 130 into which was diffused an effective amount of acid. In this embodiment, the chemistry of the affected materials is such that the same combinations of chemicals, temperature, and process will remove both the correction layer 140 and the affected portions of the edges of the feature 135. In an alternate embodiment, a first development operation may remove the correction layer 140, while a second development operation may remove material from the edges of the feature 135.

FIG. 1G shows that the feature 135 has a width before correction of $W_B$, and a width after correction of $W_A$. $W_A$ may be considered the width that is desired in the final photoresist feature, i.e., the width that will produce etched features of the correct dimensions in target layer 120 after etching. By knowing the slope of the edges before correction, the thickness of the photoresist layer, and the desired dimension $W_A$, $W_B$ may be calculated. The photoresist mask 180 (see FIG. 1B) may then be created with the proper dimensions so that the edge correction process will produce photoresist features of the correct size and shape, including smoothing and any CD reduction that is included.

Developing the correction layer and developing the photoresist material (i.e., removal of the selected areas of photoresist material) may take various forms in various embodiments, but in one embodiment development includes: 1) treatment of the structure with a solution of developer in water, 2) spinning the structure to disperse and then remove the developer, 3) rinsing the structure in deionized water for about 1 minute, and 4) spinning the structure until dry. In a particular embodiment this is the same development operation previously described to develop the photoresist material prior to applying the correction layer, with the aforementioned acid diffusion causing the edges of the photoresist material to again be susceptible to removal with the development process. In embodiments in which removal is caused by immersing the structure in liquid, the affected material may be removed by being dissolved into the liquid, while spinning and/or agitation may increase the rate of such dissolving.

FIGS. 1A–1G illustrate a structure undergoing an edge correction process on a single feature, without subsequent operations. FIGS. 3A–3E show a cross-section of a structure undergoing the edge correction process on multiple features, with subsequent processes that illustrate the usefulness of the edge correction process, according to one embodiment of the invention.

Figure 3A:
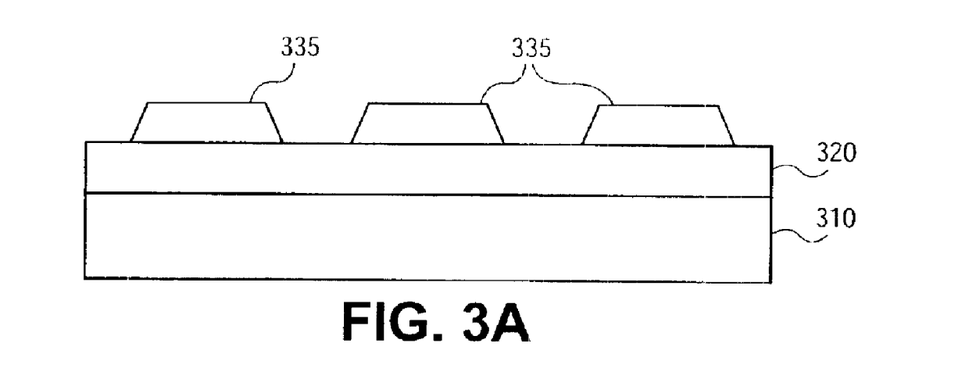
FIGS. 3A–3E show a cross-section of a structure undergoing an edge correction process on multiple features, according to one embodiment of the invention.
Figure 3B:
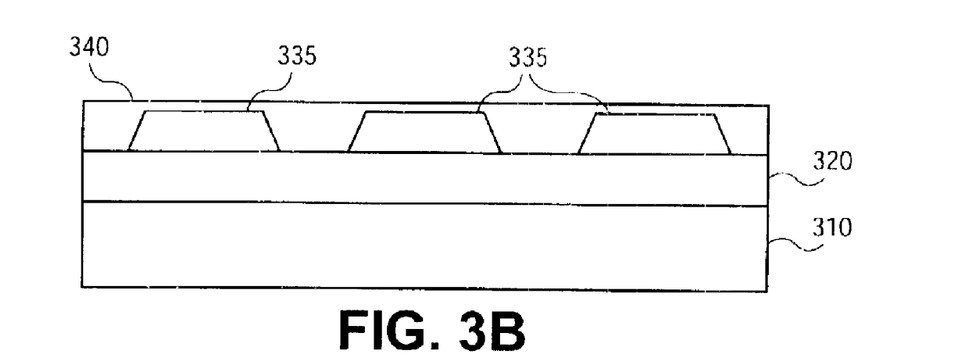

FIG. 3A shows a structure with a base layer 310, a target layer 320, and multiple patterned features 335 in a photoresist layer. The features 335 may be formed with various processes, e.g., the processes previously described for forming feature 135 in FIG. 1C. In one embodiment many such features 335, of various sizes and shapes, may be formed in the photoresist layer concurrently. FIG. 3B shows a correction layer 340 deposited on the surface of the structure, of sufficient depth to cover the exposed areas of target layer 320 and the edges of features 335. In one embodiment the correction layer 340 is deep enough to also cover the top surfaces of features 335. In one embodiment the correction layer is the same as previously described for correction layer 140 of FIG. 1D.

The structure may then be processed by: 1) exposing correction layer 340 to electromagnetic radiation (e.g., light) to cause a top-to-bottom gradient of acid in the correction layer 340, 2) heating the structure to diffuse acid into the edges of the features 335 in a profile approximating the gradient of acid, and 3) developing the correction layer 340 and features 335 to remove the correction layer 340 and to remove the portions of the edges of features 335 that have an effective amount of acid diffused into them. In one embodiment this process is the same as previously described for FIGS. 1E–1G.

Figure 3C:
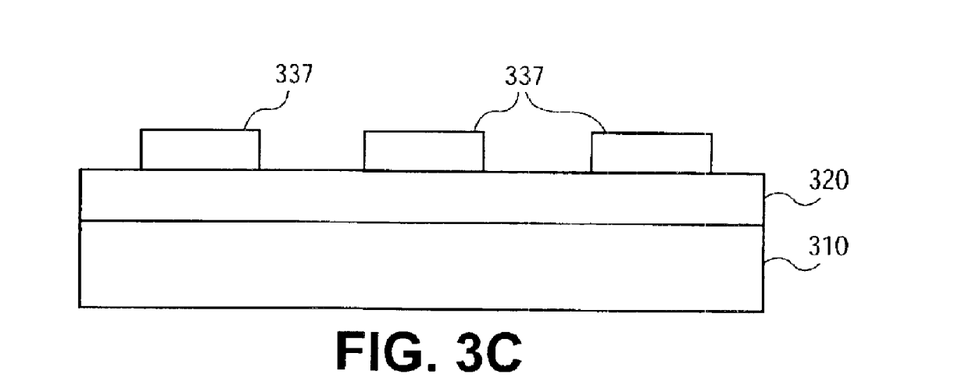

FIG. 3C shows the result, with the features 335 (with sloped edges) that are processed in the aforementioned manner becoming features 337 (with more vertical edges). The uniform thickness of the features 337 in the edge areas may help to make the subsequent etching process more predictable and controllable.

Figure 3D:
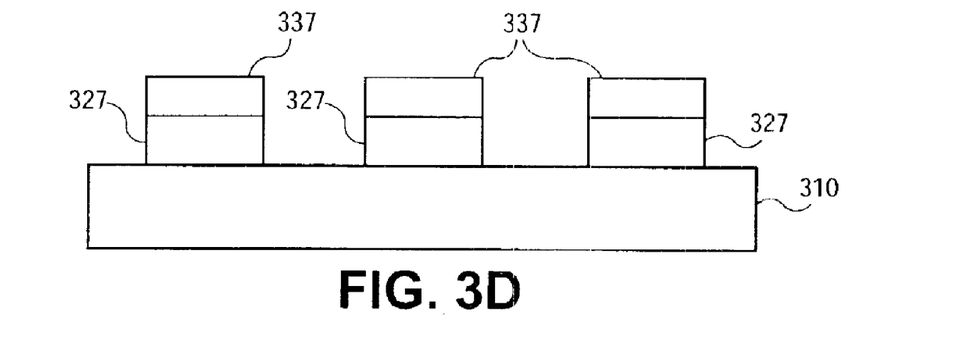

The features 337 may be used as an etching mask to etch comparable features into target layer 320. FIG. 3D shows the result after such an etching process, with features 327 being produced in target layer 320. Features 327 may have approximately the same size and shape as features 337, as indicated in FIG. 3D, although the depth of features 327 may differ from that of features 337. The etch process may be of a type that etches the material of target layer 320, but to which the photoresist material is relatively immune. In one embodiment, base layer 310 is also relatively immune to the etching effects of the etch process, and acts as an etch stop layer, rendering etched features 327 of uniform depth equal to the original depth of the target layer 320. In one embodiment the etch process is an oxygen plasma etch, but other embodiments may use other types of etch processes. Etch processes are well known, and are not further described herein to avoid obscuring an understanding of various embodiments of the invention.

Figure 3E:
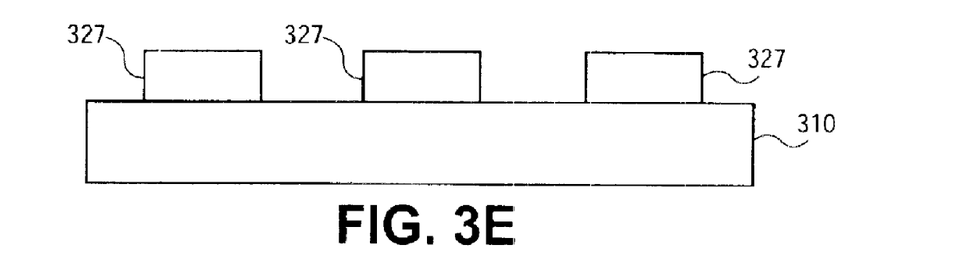

The features 337 of photoresist material may then be removed through a cleaning process, leaving the desired pattern composed of etch features 327 in the target layer 320, as shown in FIG. 3E. Photoresist-removing cleaning processes are well known, and are not further described herein to avoid obscuring an understanding of various embodiments of the invention. Although not shown, in some embodiments features 327 may act as a hard mask, and the same overall features are then etched into base layer 310, using features 327 as the etching mask. Features 327 may then be removed, leaving the desired pattern in base layer 310. This two-etch process (using a photoresist mask to etch a hard mask, and using the hard mask to etch the desired features in another layer) may be necessary when the chemistry of the final etched layer includes material that reacts unfavorably to the processes used on the photoresist material.

Regardless of the number of etch processes used, the final features may subsequently be processed in various ways (deposition, metalization, further etching, etc.) to produce the final product. Such additional processes are too numerous to describe here, and such a description would not contribute to an understanding of the various embodiments of the invention.

The foregoing description is intended to be illustrative and not limiting. Variations will occur to those of skill in the art. Those variations are intended to be included in the various embodiments of the invention, which are limited only by the spirit and scope of the appended claims.

What is claimed is:

1. A method, comprising:

depositing a first layer of material containing acid onto patterned photoresist material;

performing a first operation to create a top-to-bottom gradient of acid content in the first layer;

performing a second operation to diffuse a portion of the acid from the first layer into an edge of the patterned photoresist material; and performing a third operation to remove a portion of the edge of the patterned photoresist material containing the diffused acid.

2. The method of claim 1, wherein:

said performing a third operation comprises reshaping the edge to increase a slope of the edge.

3. The method of claim 2, wherein:

said reshaping comprises removing the portion of the edge in approximate proportion to an amount of diffused acid in the portion of the edge.

4. The method of claim 3, wherein:

said reshaping further comprises dissolving the portion of the edge in a liquid solution.

5. The method of claim 1, wherein:

said performing the second operation comprises heating the first layer.

6. The method of claim 1, wherein:

said performing the first operation comprises exposing the first layer to electromagnetic radiation.

7. The method of claim 6, wherein:

said exposing comprises exposing the first layer to deep ultraviolet radiation.

8. The method of claim 1, wherein:

said depositing the first layer comprises depositing material comprising a solution of parahydroxystyrene copolymer in a solvent with photobase additive, dye and the acid.

9. The method of claim 1, wherein:

said performing the third operation comprises dissolving the first layer in a liquid solution.

10. The method of claim 1, further comprising:

preparing a solution for the first layer by combining parahydroxystyrene copolymer, photobase additive, dye and the acid, prior to said depositing.

11. A method, comprising:

producing a first layer of patterned photoresist material on a second layer of material;

depositing a third layer of material containing acid on the first layer, the third layer in intimate contact with exposed portions of the second layer and with edges of a feature in the patterned photoresist material;

creating a gradient of acid concentration in the third layer;

diffusing a portion of the acid into the edges, an amount of diffusion relative to the gradient;

removing the third layer; and removing a portion of the photoresist material containing an effective amount of the diffused acid.

12. The method of claim 11, wherein:

said creating comprises exposing the third layer to electromagnetic radiation.

13. The method of claim 12, wherein:

the electromagnetic radiation has a wavelength of approximately 193 nanometers.

14. The method of claim 11, wherein:

said diffusing includes heating the third layer and the patterned photoresist material.

15. The method of claim 11, further comprising:

etching the second layer of material subsequent to said removing a portion of the photoresist material, using a remaining portion of the photoresist material as an etch mask.

16. The method of claim 11, wherein:

said depositing comprises applying the material containing the acid in a center of a wafer and spinning the wafer.

17. The method of claim 11, wherein:

the third layer of material comprises photobase.

* * * * *